(12) United States Patent
Zhou et al.

(10) Patent No.: US 10,161,044 B2
(45) Date of Patent: *Dec. 25, 2018

(54) POLYMER PRODUCT AND METHOD FOR SELECTIVELY METALLIZING POLYMER SUBSTRATE

(71) Applicant: BYD COMPANY LIMITED, Shenzhen, Guangdong (CN)

(72) Inventors: Wei Zhou, Shenzhen (CN); Bifeng Mao, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 22 days.

This patent is subject to a terminal disclaimer.

(21) Appl. No.: 15/447,522

(22) Filed: Mar. 2, 2017

(65) Prior Publication Data

US 2017/0175270 A1   Jun. 22, 2017

Related U.S. Application Data

(63) Continuation of application No. PCT/CN2015/080928, filed on Jun. 5, 2015.

(30) Foreign Application Priority Data

Sep. 4, 2014 (CN) .......................... 2014 1 0448481
Sep. 4, 2014 (CN) .......................... 2014 1 0449096

(51) Int. Cl.

| | | |
|---|---|---|
| B01J 23/20 | (2006.01) | |
| C23C 18/16 | (2006.01) | |
| C08K 3/22 | (2006.01) | |
| C08L 77/06 | (2006.01) | |
| C23C 18/20 | (2006.01) | |
| C23C 18/40 | (2006.01) | |
| H05K 3/18 | (2006.01) | |
| C09D 11/10 | (2014.01) | |
| C09D 11/322 | (2014.01) | |
| B01J 35/00 | (2006.01) | |
| B01J 35/02 | (2006.01) | |
| B01J 37/00 | (2006.01) | |
| B01J 37/08 | (2006.01) | |
| C23C 18/18 | (2006.01) | |
| C09D 11/03 | (2014.01) | |
| C09D 11/102 | (2014.01) | |
| C09D 11/38 | (2014.01) | |
| C09D 11/52 | (2014.01) | |
| C09D 167/02 | (2006.01) | |
| C09D 169/00 | (2006.01) | |
| C09D 177/10 | (2006.01) | |
| C25D 3/12 | (2006.01) | |
| C08K 9/02 | (2006.01) | |

(52) U.S. Cl.
CPC ........... *C23C 18/1612* (2013.01); *B01J 23/20* (2013.01); *B01J 35/0013* (2013.01); *B01J 35/026* (2013.01); *B01J 37/0072* (2013.01); *B01J 37/08* (2013.01); *C08K 3/22* (2013.01); *C08L 77/06* (2013.01); *C09D 11/03* (2013.01); *C09D 11/10* (2013.01); *C09D 11/102* (2013.01); *C09D 11/322* (2013.01); *C09D 11/38* (2013.01); *C09D 11/52* (2013.01); *C09D 167/02* (2013.01); *C09D 169/00* (2013.01); *C09D 177/10* (2013.01); *C23C 18/1633* (2013.01); *C23C 18/1641* (2013.01); *C23C 18/1646* (2013.01); *C23C 18/1655* (2013.01); *C23C 18/1893* (2013.01); *C23C 18/20* (2013.01); *C23C 18/204* (2013.01); *C23C 18/2066* (2013.01); *C23C 18/40* (2013.01); *C25D 3/12* (2013.01); *H05K 3/182* (2013.01); *H05K 3/185* (2013.01); *C08K 9/02* (2013.01); *C08K 2003/2231* (2013.01); *C23C 18/1608* (2013.01); *C23C 18/1653* (2013.01); *H05K 2201/0236* (2013.01); *H05K 2203/0709* (2013.01); *H05K 2203/107* (2013.01)

(58) Field of Classification Search
USPC ........................................................ 428/457
See application file for complete search history.

(56) References Cited

U.S. PATENT DOCUMENTS

| | | | |
|---|---|---|---|
| 5,599,592 A | 2/1997 | Laude | |
| 2011/0094577 A1 | 4/2011 | Chatterjee et al. | |
| 2014/0120315 A1 | 5/2014 | Aitken et al. | |
| 2017/0175271 A1* | 6/2017 | Zhou | C23C 18/1633 |

FOREIGN PATENT DOCUMENTS

| | | |
|---|---|---|
| CN | 104275886 A | 1/2015 |
| CN | 104311873 A | 1/2015 |
| WO | 02/079542 A3 | 2/2003 |

OTHER PUBLICATIONS

International Search Report and Written Opinion for Application No. PCT/CN2015/080928, dated Jul. 28, 2015, 9 pages.

* cited by examiner

*Primary Examiner* — Terressa Boykin
(74) *Attorney, Agent, or Firm* — Sheppard Mullin Richter & Hampton LLP

(57) ABSTRACT

A polymer product with a metal layer coated on the surface thereof is provided. The polymer product includes a polymer substrate and a metal layer formed on at least a part of a surface of the polymer substrate. The surface of the polymer substrate covered by the metal layer is formed by a polymer composition comprising a polymer and a doped tin oxide. A doping element of the doped tin oxide comprises niobium. The doped tin oxide has a coordinate L* value of about 70 to about 100, a coordinate a value of about −5 to about 5, and a coordinate b value of about −5 to about 5 in a CIELab color space.

18 Claims, No Drawings

POLYMER PRODUCT AND METHOD FOR SELECTIVELY METALLIZING POLYMER SUBSTRATE

CROSS-REFERENCE TO RELATED APPLICATION

This application is a continuation application of International Application No. PCT/CN2015/080928, filed on Jun. 5, 2015, which is based on and claims priority to and benefits of Chinese Patent Application No. 201410449096.X and No. 201410448481.2, both filed with the State Intellectual Property Office (SIPO) of the People's Republic of China on Sep. 4, 2014. The entire contents of the above-referenced applications are incorporated herein by reference.

FIELD

Embodiments of the disclosure generally relate to a material field, and particularly to selective metallization via chemical plating, and more particularly to a polymer product with at least a part of a surface thereof coated with a metal layer, and a method for selectively metalizing a surface of a polymer substrate.

BACKGROUND

Providing a metal layer on a selected area of a surface of an insulating substrate such as a plastic in order to form a passage for transmitting electro-magnetic signals is widely applied in the field of automobile, computer, communications, and so on. The metal layer can be formed on the surface of the insulating substrate such as a plastic in various ways.

There are various methods to form a metal layer on the surface of the insulating substrate such as a plastic, which should be further improved.

SUMMARY

In viewing thereof, the present disclosure is directed to solve at least one problem existing in the art, for example, conventional methods for selective metallization on a surface of the insulating substrate such as plastic to form a metal layer via chemical plating, using metal oxides with light color as chemical plating promoters, with low plating speed and leakage of plating.

Embodiments of a first aspect of the present disclosure provide a polymer product. The polymer product includes: a polymer substrate; and a metal layer formed on at least a part of a surface of the polymer substrate. The surface of the polymer substrate covered by the metal layer is formed by a polymer composition. The polymer composition includes a polymer and a doped tin oxide. A doping element of the doped tin oxide includes niobium, and the doped tin oxide has a coordinate L* value of about 70 to about 100, a coordinate a value of about −5 to about 5, and a coordinate b value of about −5 to about 5 in a CIELab color space.

In some embodiments, the doped tin oxide has a light reflectivity of no more than 60% to a light with a wavelength of about 1064 nm.

In some embodiments, based on the total weight of the doped tin oxide, the content of the tin oxide is about 70 wt % to about 99.9 wt %, and the content of the niobium is about 0.1 wt % to about 30 wt % calculated as $Nb_2O_5$.

In some embodiments, the doped tin oxide has an average particle size of about 10 nm to about 10 μm.

In some embodiments, the doped tin oxide is prepared by steps including: providing a powder mixture including a tin oxide and at least one compound containing a doping element, and sintering the powder mixture under an oxidizing atmosphere. The compound contains at least one of an oxide of the doping element and a precursor capable of forming the oxide of the doping element under the sintering.

In some embodiments, in the polymer composition, based on 100 weight parts of the polymer, the content of the doped tin oxide is about 1 to about 40 weight parts, preferably about 1 to about 5 weight parts.

Embodiments of a second aspect of the present disclosure provide a method for selectively metalizing a surface of a polymer substrate. The method includes: removing at least a part of a surface of the polymer substrate by irradiating the surface with an energy source; and forming at least one metal layer on the surface of the polymer substrate by chemical plating. The surface of the polymer substrate is formed by a polymer composition. The polymer composition includes a polymer and a doped tin oxide. A doping element of the doped tin oxide includes niobium, and the doped tin oxide has a coordinate L* value of about 70 to about 100, a coordinate a value of about −5 to about 5, and a coordinate b value of about −5 to about 5 in a CIELab color space.

In some embodiments, the doped tin oxide has a light reflectivity of no more than 60% to a light with a wavelength of about 1064 nm.

In some embodiments, based on the total weight of the doped tin oxide, the content of the tin oxide is about 70 wt % to about 99.9 wt %, and the content of the niobium is about 0.1 wt % to about 30 wt % calculated as $Nb_2O_5$.

In some embodiments, the doped tin oxide has an average particle size of about 10 nm to about 10 μm.

In some embodiments, the doped tin oxide is prepared by steps including: providing a powder mixture including a tin oxide and at least one compound containing a doping element, and sintering the powder mixture in an oxidizing atmosphere. The compound contains at least one of an oxide of the doping element and a precursor capable of forming the oxide of the doping element under the sintering.

In some embodiments, in the polymer composition, based on 100 weight parts of the polymer, the content of the doped tin oxide is about 1 to about 40 weight parts, preferably about 1 to about 5 weight parts.

In some embodiments, the energy source is a laser.

In some embodiments, the laser has a wavelength of about 1064 nm and a power of about 3-40 W.

In some embodiments, removing the part of the polymer substrate is performed by gasifying the part of the polymer substrate.

Embodiments of a third aspect of the present disclosure provide a polymer product obtained by the above-mentioned method.

With the doped tin oxide containing niobium as its doping element used to form the surface to be metalized of a polymer product or a polymer substrate, the doped tin oxide with light color, does not or substantially does not significantly interfere with the color of the polymer product or the polymer substrate.

Additionally, the doped tin oxide mentioned in the present disclosure has a strong ability to promote chemical plating without reducing the metal element thereof to pure metal, i.e. the doped tin oxide may be used as a chemical plating promoter with a flexible usage scope. The doped tin oxide may not only be preset in an insulating substrate such as polymer, but may also be directly coated or printed on a surface of the substrate as an ink layer. More importantly, when using the doped tin oxide as a chemical plating promoter, a higher plating speed may be obtained and a continuous metal layer may be formed with an enhanced adhesion layer between the metal layer and the insulating substrate, with both the production efficiency and the quality of the plating parts improved.

The method for selectively metalizing a surface of a polymer substrate according to the present disclosure is particularly useful for preparing products having a high requirement with color, for example, lighter color products.

Additional aspects and advantages of the embodiments of the present disclosure will be given in part in the following descriptions, become apparent in part from the following descriptions, or be learned from the practice of the embodiments of the present disclosure.

DETAILED DESCRIPTION

Reference will be made in detail to embodiments of the present disclosure. The embodiments described herein are explanatory and illustrative, which are used to generally understand the present disclosure. The embodiments shall not be construed to limit the present disclosure.

For the purpose of the present description and of the following claims, the definitions of the numerical ranges always include the extremes unless otherwise specified.

In addition, terms such as "first" and "second" are used herein for purposes of description and are not intended to indicate or imply relative importance or significance.

A polymer product according to embodiments of the present disclosure will be discussed below in details.

According to an embodiment of the present disclosure, the polymer product includes: a polymer substrate; and a metal layer formed on at least a part of a surface of the polymer substrate. The surface of the polymer substrate covered by the metal layer is formed by a polymer composition. The polymer composition includes a polymer and a doped tin oxide; and the doped tin oxide contains niobium as its doping element.

According to embodiments of the present disclosure, based on the total weight of the doped tin oxide, the content of Sn is not less than the content of Nb, calculated as oxide. Preferably, the content of Sn is more than the content of Nb in the doped tin oxide.

In one embodiment, based on the total weight of the doped tin oxide, the content of the tin oxide is about 70 wt % to about 99.9 wt %, preferably about 90 wt % to about 96 wt %. The content of the niobium is about 0.1 wt % to about 30 wt % calculated as $Nb_2O_5$, preferably about 1 wt % to about 20 wt %, more preferably about 4 wt % to about 10 wt %. The composition of the doped tin oxide may be determined by any conventional analysis and test methods, for example, it can be tested by inductively coupled plasma-atomic emission spectrometry (ICP-AES), or determined by the amount of raw materials used for preparing thereof. According to the present disclosure, the definitions of the numerical ranges always include the endpoint value thereof unless otherwise specified.

In some embodiments, the doped tin oxide has an average particle size of about 10 nm to about 10 μm, preferably about 50 nm to about 5 μm, more preferably about 80 nm to about 2.5 μm. The average particle size may be determined by any conventional method, for example, measured by a laser particle analyzer.

The doped tin oxide according to embodiments of the present disclosure, has a CIELab color value L* of about 70 to about 100, a CIELab color value a of about −5 to about 5, and a CIELab color value b of about −5 to about 5. In other words, the doped tin oxide may have a coordinate L* value of about 70 to about 100, a coordinate a value of about −5 to about 5, and a coordinate b value of about −5 to about 5 in a CIELab color space. In a preferred embodiment, the CIELab color value L* is about 80 to about 90, the CIELab color value a is about −5 to about 2, and the CIELab color value b is about 2 to about 4 for the disclosed dope tin oxide. The doped tin oxide with above preferred CIELab color value ranges, has a light color on one hand, and shows a good ability of promoting chemical plating on the other hand. The above-mentioned doped tin oxide can form an enhanced adhesive metal layer with the substrate with a high plating speed during the chemical plating process.

The doped tin oxide has very strong absorption power to light, and has a light reflectivity no more than 60% at a wavelength of 1064 nm, and even no more than 40%, for example, about 20% to about 30%. According to the present disclosure, the light reflectivity of the doped tin oxide is tested by a prescribed method refer to GJB 5023.1-2003.

In some embodiments, the doped tin oxide can be prepared by steps including: providing a powder mixture including a tin oxide and at least one compound containing a doping element, in which the doping element includes niobium; and then sintering the powder mixture in an oxidizing atmosphere. In other words, in some embodiments, the doped tin oxide may be prepared by steps of: providing a powder mixture including a tin oxide and at least one compound containing a doping element including niobium; and then sintering the powder mixture in an oxidizing atmosphere. The obtained compound includes at least one of an oxide of the doping element and a precursor capable of forming the oxide of the doping element through sintering. The oxide of the doping element, such as the oxide of niobium, may be $Nb_2O_5$. The precursor used to form the oxide of the doping element under the sintering may be any compound capable of forming the oxide of the doping element, such as hydroxides (e.g. niobium hydroxide) and/or a gel (e.g. niobium-containing gel). While the powder mixture is prepared by methods of semi-dry grinding or wet grinding as described below, the precursor may be a compound insoluble in the dispersant used in the methods of the semi-dry grinding or wet grinding.

The amounts of the tin oxide and the compound in the powder mixture can be selected according to the desired doping element content in the doped tin oxide. Usually, the composition of the powder mixture may be adjusted to produce the following contents: the amount of the tin oxide is about 70 wt % to about 99.9 wt %, preferably about 90 wt % to about 96 wt %; and the amount of the niobium is about 0.1 wt % to about 30 wt % calculated as $Nb_2O_5$, preferably about 1 wt % to about 20 wt %, more preferably about 4 wt % to about 10 wt %, based on the total weight of the doped tin oxide intended.

There is no special limit to the method for preparing the powder mixture, which may be selected depending on actual practice. In some embodiments, the powders may be obtained by grinding the tin oxide and the metal compound containing the doping element. The grinding may be performed by a dry grinding process, a wet grinding process, or a semi-dry grinding process. In some embodiments, the semi-dry grinding process and the wet grinding process may be carried out using a dispersant. The dispersant may be any normally used dispersant in a conventional grinding process. In some embodiments, the dispersant may be water and/or $C_1$-$C_5$ alcohol, for example, ethanol. The amount of the dispersant may be any known amount without special limit. In some embodiments, the powders may be obtained by a wet grinding process or a semi-dry grinding process. The wet grinding process and the semi-dry grinding process may further include a drying step. The drying may be carried out by a conventional drying process. In some embodiments, the drying is carried out at a temperature ranging from about 40° C. to about 120° C. In some embodiments, the drying may be carried out under an atmosphere containing oxygen, or under a non-reactive atmosphere. The atmosphere containing oxygen may be air or a combination of oxygen and a non-reactive gas. The non-reactive gas may refer to any gas which may not react chemically with the components of the powders or the prepared metal compound. For example, the non-reactive gas may be those selected from group 0 of the periodic table or nitrogen. In some embodiment, the non-reactive gas may be argon.

There is no special limit to the particle size of the powder mixture in the present disclosure, which may be chosen based on practical requirements. In some embodiments, the powder mixture has an average particle size of about 50 nm to about 10 μm. In some embodiments, the powder mixture has an average particle size of about 500 nm to about 5 μm.

In some embodiments, the sintering may be conducted at a temperature ranging from about 500° C. to about 1800° C. In some embodiments, the sintering may be conducted at a temperature ranging from about 600° C. to about 1500° C. In some embodiments, the sintering may be conducted at a temperature not higher than about 1300° C., and thus obtained doped tin oxide has a light colour similar to the powder mixture, i.e. raw materials. From the viewpoint of further improving the promoting power of the doped tin oxide, the sintering may be conducted preferably at a temperature of higher than about 800° C., more preferably higher than about 1000° C. When the sintering temperature is about 1000° C. to 1300° C., the obtained doped tin oxide has a light color similar to the powder mixture, and shows a good ability of promoting chemical plating. The condition for sintering may be selected according to the sintering temperature, and the sintering may be performed for a time period ranging from about 1 hour to about 30 hours, preferably about 4 hours to about 10 hours.

In some embodiments, the sintering may be carried out under an oxidizing atmosphere. The oxidizing atmosphere is generally an atmosphere containing oxygen. For example, the atmosphere containing oxygen may be pure oxygen atmosphere. Alternatively, the atmosphere containing oxygen may be a combination of oxygen and a non-reactive gas. The non-reactive gas may refer to any gas which may not react chemically with the raw materials and the products of the sintering process. For example, the non-reactive gas may be those selected from group 0 of the periodic table or nitrogen. In some embodiment, in an oxidizing atmosphere containing oxygen and non-reactive gas, the volume amount of oxygen is preferably more than about 70 vol %. The atmosphere containing oxygen may be air.

In some embodiments, the method further includes a step of grinding a solid product obtained from the sintering step in order to provide the final product with more desired properties. In some embodiments, the particle size of a grinded product obtained from the grinding step may have an average particle size ranging from about 10 nm to about 10 μm. In some embodiments, the grinded product may have an average particle size ranging from about 50 nm to about 5 μm. In some embodiments, the grinded product may have an average particle size ranging from about 80 nm to about 2.5 μm. The further grinding may be performed by at least one process selected from a group including: dry grinding process, wet grinding process and semi-dry grinding process, which may include conventional methods and have been described above. In some embodiments, the semi-dry grinding process and the wet grinding process may be carried out using a dispersant. The dispersant may be any normally used dispersant in a conventional grinding process. In some embodiments, the dispersant may be water and/or $C_1$-$C_5$ alcohol, for example, ethanol. The amount of the dispersant may be any amount that is known, without special limit.

In some embodiments, in the polymer composition, based on 100 weight parts of the polymer, the content of the doped tin oxide is about 1 to about 40 weight parts. In some embodiments, in the polymer composition, based on 100 weight parts of the polymer, the content of the doped tin oxide is about 1 to about 30 weight parts. In some embodiments, in the polymer composition, based on 100 weight parts of the polymer, the content of the doped tin oxide is about 1 to about 20 weight parts. In some embodiments, in the polymer composition, based on 100 weight parts of the polymer, the content of the doped tin oxide is about 1 to about 10 weight parts. With the strong ability of the doped tin oxide as mentioned above to promote chemical plating, even at a lower content, such as based on 100 weight parts of the polymer, the amount of the doped tin oxide may be about 1 to about 5 weight parts, or even about 1 to about 3 weight parts, the polymer product formed by the polymer composition is still capable of electroless plating after the energy beam irradiation for peeling the polymer. A higher plating speed can be obtained, forming a complete continuous metal layer with a high adhesion to the substrate.

There is no special limit to the type of the polymer in the polymer composition, and it may be selected according to practical requirements. In some embodiments, the polymer may be a thermoplastic polymer or a thermosetting polymer. In an embodiment, the polymer composition includes a base polymer that may be at least one selected from a group including: plastic, rubber and fiber. By way of example and without limits, in some embodiments the polymer may be at least one selected from a group including: polyolefin, such as polystyrene, polypropylene, poly(methyl methacrylate) and poly(acrylonitrile-butadiene-styrene); polycarbonate; polyester, such as poly(cyclohexylene dimethylene terephthalate), poly(diallyl isophthalate), poly(diallyl terephthalate), poly(butylene naphthalate), poly(ethylene terephthalate) and poly(butylene terephthalate); polyamide, such as poly(hexamethylene adipamide), poly(hexamethylene azelamide), poly(hexamethylene succinamide), poly(hexamethylene lauramide), poly(hexamethylene sebacamide), poly(decamethylene sebacamide), polyundecanamide, poly(lauramide), poly(octanamide), poly(9-amino nonanoic acid), polycaprolactam, poly(phenylene terephthamide), poly(hexylene isophthalamide), polyhexamethylene terephthalamide and poly(nonylene terephthamide); poly(aromatic ether); polyether imide; polycarbonate/(acrylonitrile-butadiene-styrene) alloy; polyphenylene oxide; polyphenylene sulfide; polyimide; polysulfone; poly(ether-ether-ketone); polybenzimidazole; phenol formaldehyde resin; urea formaldehyde resin; melamine-formaldehyde resin; epoxide resin; alkyd resin; and polyurethane.

In some embodiments, the polymer composition may further contain at least one additive. In some embodiments, the additive may be, for example, filler, antioxidant, light stabilizer and lubricant and so on. By the addition of the additive, the performance and property of the polymer product may be improved, and the processing performance of the polymer composition may be improved. There is no special limit to the content and the type of the additive, provided the colour of the additive is light. The additive may be selected according to, for example, practical requirements.

The filler used as the additive to the polymer composition may be any filler which is non-reactive under the effect of laser (either physically or chemically). In some embodiments, the filler may be at least one selected from talc and/or calcium carbonate.

In some embodiments, the filler may be glass fiber. With the addition of glass fiber, the thickness of the removed substrate (in other words, the distance from the top surface of the polymer product to the exposed doped tin oxide) may be significantly increased, which may facilitate the deposition of metal onto the doped tin oxide during the following chemical plating process.

The filler may be any conventional inorganic filler which may act with the effect of the energy source, such as the laser. In some embodiments, the filler may also be selected from a group including micro glass bead, calcium sulfate, barium sulfate, titanium dioxide, pearl powder, wollastonite, diatomite, caoline, coal fines, pot clay, mica, oil shale ash, aluminum silicate, alumina, silica, talc and zinc oxide.

The antioxidant used as the additive to the polymer product formed by the polymer composition may be any conventional antioxidant in the related art. In some embodiments, the antioxidant may contain a primary antioxidant and a secondary antioxidant. The ratio between the primary antioxidant and the secondary antioxidant may be appropriately selected according to, for example, the type of the antioxidants. In some embodiments, the weight ratio between the primary antioxidant and the secondary antioxidant may be about 1:1-4.

In some embodiments, the primary antioxidant may be a hindered phenol antioxidant. By way of example but without limits, in some embodiments, the primary antioxidant may be antioxidant 1098 or antioxidant 1010, in which the antioxidant 1098 mainly contains N,N'-bis-(3-(3,5-di-tert-butyl-4-hydroxyphenyl)propionyl)hexane diamine and the antioxidant 1010 mainly contains tetra[3-(3,5-di-tert-butyl-4-hydroxyphenyl)propionic acid]pentaerythritol.

In some embodiments, the secondary antioxidant may be a phosphite ester antioxidant. By way of example and without limits, in some embodiments, the secondary antioxidant may be antioxidant 168, which mainly contains tri(2,4-di-tert-butyl-phenyl)phosphorite.

In some embodiments, the light stabilizer used as the additive to the polymer article may be of the hindered amine type. In some embodiments, the light stabilizer may be bis(2,2,6,6-tetramethyl-4-piperidyl)sebacate. The light stabilizer may be any known ones in the art, without special limit in the present disclosure.

In some embodiments, the lubricant may be at least one selected from a group including: ethylene/vinyl acetate copolymer (EVA wax), polyethylene (PE wax) and stearate. With the addition of the lubricant, the flowing performance of the polymer product may be improved.

In some embodiments, the amount of the additive may be appropriately selected according to functions and types of the additives. In some embodiments, based on 100 weight parts of the polymer composition, the content of the filler may range from 1 weight part to 40 weight parts, the content of the antioxidant may range from about 0.1 weight parts to about 10 weight parts, the content of the light stabilizer may range from about 0.1 weight parts to about 10 weight parts, and the content of the lubricant may range from about 0.1 weight parts to about 10 weight parts.

In some embodiments, only a part of a surface of the polymer substrate may be formed by the polymer composition. Alternatively, the whole polymer substrate may be formed by the polymer composition as mentioned above, i.e., the entire polymer substrate is formed by the polymer composition. From the viewpoint of cost reduction, only a surface or a part of a surface of the polymer substrate may be formed by the polymer composition if the thickness thereof is very large. The polymer substrate may be integrally formed by the polymer composition if the thickness is not very large.

The size of the polymer substrate may be selected properly according to intended use of the case, without special limits in the present disclosure. The polymer substrate can be any shape according to practical use.

In some embodiments, the polymer substrate may be prepared by any conventional molding process known in the art, without special limits in the present disclosure. In some embodiments, the molding process is performed by injection molding. In another embodiment, the molding process is performed by extrusion molding.

According to the present disclosure, the thickness of the metal layer may be selected by practical requirements, without special limits. In some embodiments, the thickness of the metal layer is about 0.1 µm to about 10 µm.

In some embodiments, the shape of the metal layer may be selected by practical requirements. For example, if the polymer article obtained after the chemical plating is used to prepare a circuit board, the metal layer may have a metal layer pattern.

Embodiments of a second aspect of the present disclosure provide a method for selectively metalizing a surface of a polymer substrate. The method includes: removing at least a part of a surface of the polymer substrate by irradiating the surface with an energy source, for example by gasifying; and forming at least one metal layer on the surface of the polymer substrate by chemical plating. The surface of the polymer substrate is formed by a polymer composition. The polymer composition includes a polymer and a doped tin oxide; and a doping element of the doped tin oxide includes niobium. The doped tin oxide has a coordinate L* value of about 70 to about 100, a coordinate a value of about −5 to about 5, and a coordinate b value of about −5 to about 5 in a CIELab color space.

According to the present disclosure, the doped tin oxide, the polymer composition and the polymer substrate are described above in detail.

In some embodiments, the energy source may be at least one selected from a group including: laser, electron beam and ion beam. In an embodiment, the energy source is a laser. The energy provided by the laser is high enough to cause the polymer substrate in the irradiated area of the surface thereof to be gasified and the doped tin oxide in the irradiated area is exposed.

In some embodiments, the irradiating step may be performed by using a laser, which may have a wavelength of 157-10600 nm and a power of 1-100 W.

The doped tin oxide has excellent absorption capability to energy provided by the energy source, and thus the polymer substrate in the predetermined part may be removed and the doped tin oxide in the predetermined part may be exposed, even irradiated with the energy source which provides relatively lower energy. In an embodiment, the laser may have a wavelength of 1064-10600 nm and a power of 3-50 W. In another embodiment, the laser may have a wavelength of 1064 nm and a power of 3-40 W. In a further embodiment, the laser may have a wavelength of 1064 nm and a power of 5-10 W. The predetermined part of the surface of the polymer substrate may form a pattern, and then the metal layer formed on the predetermined part may form a metal pattern on the polymer substrate. With the laser, the precision of the metal pattern may be improved.

In some embodiments, the irradiating step may be performed by using an electron beam, which may have a power density of $10\text{-}10^{11}$ W/cm$^2$.

In some embodiments, the irradiating step may be performed by using an ion beam, which may have an energy of $10\text{-}10^6$ eV.

In some embodiments, the chemical plating may be carried out with the following steps. The polymer substrate subjected to the irradiating is immersed in a solution of copper (referred to as Cu solution). In some embodiments, the Cu solution may contain a Cu salt. In some embodiments, the Cu solution may further contain a reducing agent. In some embodiments, the Cu solution may have a pH ranging from about 12 to about 13. In some embodiments, the reducing agent may reduce the Cu ions in the Cu salt into Cu metal. In some embodiments, the reducing agent may be at least one selected from a group including: glyoxylic acid, diamide, and sodium phosphorate.

The thickness of the metal layer formed by chemical plating may be selected based on practical requirements, without special limit. In some embodiments, the thickness of the metal layer is about 0.1 μm to about 10 μm.

In some embodiments, the shape of the metal layer may be selected based on practical requirements. For example, if the polymer article obtained after the chemical plating is used to prepare a circuit board, the metal layer may be a metal layer pattern.

In some embodiments, the method may further include a step of electroplating or chemical plating. The electroplating or chemical plating may be performed for at least one time, so that additional metal layers, either of the same metal as or of different metals from the prior metal layers, may be formed on the prior metal layers. In some embodiments, a Cu layer is formed on the surface of the polymer substrate in the first chemical plating step, and then a Ni layer is formed on the Cu layer in the following electroplating or chemical plating. With the additional Ni layer, oxidation of the Cu layer may be prevented.

Embodiments of a third aspect of the present disclosure provide a polymer product obtained by the above-mentioned method. The polymer product includes a polymer substrate; and a metal layer formed on at least a part of a surface of the polymer substrate. The metal layer is a complete continuous metal layer with a high adhesion to the polymer substrate.

It will be understood that the features mentioned above and those still to be explained hereinafter may be used not only in the particular combination specified but also in other combinations or on their own, without departing from the scope of the present invention.

Some illustrative and non-limiting examples are provided here under for a better understanding of the present invention and for its practical embodiment.

Test

Samples of the doped tin oxides and the polymer product obtained from the following Embodiments and Comparative Embodiments were subjected to the following tests.

Composition

In the following Embodiments and Comparative Embodiments, the composition of the doped tin oxide was measured by the amount of raw materials used for preparing thereof.

Average Particle Size

In the following Embodiments and Comparative Embodiments, the average particle size of the doped tin oxide was measured by a Laser Particle Sizer commercially available from Chengdu Jingxin Powder Analyse Instrument Co., Ltd., China.

Light Reflectivity

In the following Embodiments and Comparative Embodiments, the light reflectivity of the doped tin oxide was measured by a prescribed method refer to CN national standard GJB 5023.1-2003 viaLambda 750 UV/VIS/NIR spectrophotometer measured at a wavelength of 1064 nm.

Adhesion

In the following Embodiments and Comparative Embodiments, the adhesion between the metal layer and the polymer sheet was determined by a cross-cut process. Specifically, a surface of the sample to be measured was cut using a cross-cut knife to form 100 grids (1 mm×1 mm). A gap between adjacent grids was formed to reach the bottom of the metal layer. Debris in the test region was cleaned using a brush, and then an adhesive tape (3M600 gummed paper) was sticked to a tested grid. One end of the sticked adhesive paper was rapidly torn off in a vertical direction. Two identical tests were performed on the same grid region. The grade of the adhesion was determined according to the following standard:

Grade 5B: the cut edge is smooth and the metal layers both at the cut edge and cut intersection of the grid does not fall off;

Grade 4B: the metal layers at the cut intersection are partly removed, but no more than 5% (area percent) of the metal layers are removed;

Grade 3B: the metal layers both at the cut edge and the cut intersection are partly removed, and 5-15% (area percent) of the metal layers are removed;

Grade 2B: the metal layers at both the cut edge and the cut intersection are partly removed, and 15-35% (area percent) of the metal layers are removed;

Grade 1B: the metal layers at both the cut edge and the cut intersection are partly removed, and 35-65% (area percent) of the metal layers are removed;

Grade 0B: the metal layers at both the cut edge and the cut intersection are partly removed, and more than 65% (area percent) of the metal layers are removed.

The results are shown in Table 1.

Embodiment 1

The present Embodiment 1 includes the following steps.

Step 1) Particles of SnO$_2$ were grinded in a grinding mill for 2 h together with Nb$_2$O$_5$ and ethanol, to form a first mixture. Based on 100 weight parts of SnO$_2$ and Nb$_2$O$_5$, the amount of ethanol was 250 weight parts. Based on the total amount of SnO$_2$ and Nb$_2$O$_5$, the content of Nb$_2$O$_5$ was 10 wt %. The first mixture was dried under an air atmosphere at 60° C. for 3 h, thus obtaining a second mixture having an average particle size of 1.5 μm. The second mixture was calcined under an air atmosphere at 1050° C. for 5 h and grinded to powders having an average particle size of 1.2 μm. The powders included doped tin oxide, and its CIELab color value and light reflectivity are listed in Table 1.

Step 2) The powders of doped tin oxide were mixed with polyhexamethylene terephthalamide (referred to as PA6T) and antioxidant 1010 to form a third mixture. Then the third mixture was extruded and pelleted with an extruder to form pellets. The pellets were injection molded in an injection mould, thus forming a PA6T sheet containing the doped tin oxide. Based on 100 weight parts of the PA6T, the amount of the doped tin oxide was 5 weight parts, the amount of the antioxidant 1010 was 10 weight parts. The CIELab color value of the PA6T sheet was listed in Table 1.

Step 3) A surface of the PA6T sheet was irradiated with a laser provided by a YAG laser, to remove PA6T on a predetermined part (corresponding to the structure of a receiver) of the surface of the PA6T sheet. The laser had a wavelength of 1064 nm, a power of 5 W, a frequency of 30 kHz, a scanning speed of 1000 mm/s and a filling distance of 30 μm.

Step 4) The PA6T sheet irradiated with laser was subjected to chemical plating by using a Cu solution for 1 h, thus forming a metal layer on the predetermined part of the surface of the PA6T sheet. The metal layer may be used as an antenna. The Cu solution contained: 0.12 mol/L of $CuSO_4.5H_2O$, 0.14 mol/L of $Na_2EDTA.2H_2O$, 10 mg/L of potassium ferrocyanide, 10 mg/L of 2,2'-bipyridine and 0.10 mol/L of glyoxylic acid. The Cu solution had a temperature of 50° C. and a pH of 12.5-13 which was adjusted with NaOH and $H_2SO_4$.

Then the PA6T sheet formed with the metal layer was observed, and it was found that the metal layer formed a continuous complete circuit on the PA6T sheet, without leakage of plating. The plating speed and adhesion between the metal layer and the PA6T were both listed in Table 1.

Comparative Embodiment 1

The present Comparative Embodiment 1 includes the following steps.

Step 1) Particles of $SnO_2$ (raw material of step 1) in Embodiment 1) was mixed with PA6T and antioxidant 1010 to form a mixture. Then the mixture was extruded and pelleted with the same condition as described in the step 2) of Embodiment 1, thus forming a PA6T sheet containing tin oxide. Based on 100 weight parts of the PA6T, the amount of the particles of $SnO_2$ was 5 weight parts, and the amount of the antioxidant 1010 was 10 weight parts.

Step 2) The PA6T sheet obtained from the step 1) was irradiated with a laser under the same condition as described in the step 3) of Embodiment 1.

Step 3) The PA6T sheet irradiated with laser was subjected to a chemical plating under the same condition as described in the step 4) of Embodiment 1.

It was observed that, a complete metal circuit cannot be formed on the PA6T sheet.

Comparative Embodiment 2

The present Comparative Embodiment 2 includes the following steps.

Step 1) The step of preparing the doped tin oxide was substantially the same as the step 1) of Embodiment 1, with the exception that: the same amount of $Sb_2O_3$ was used instead of $Nb_2O_5$. The CIELab color value of the PA6T sheet was listed in Table 1.

Step 2) The step of preparing the PA6T sheet was substantially the same as the step 2) of Embodiment 1, with the exception that: the doped tin oxide was those obtained from the step 1) of Comparative Embodiment 2. The CIELab color value of the PA6T sheet was listed in Table 1.

Step 3) The PA6T sheet was irradiated with a laser under the same condition as described in the step 3) of Embodiment 1.

Step 4) The PA6T sheet irradiated with laser was subjected to a chemical plating under the same condition as described in the step 4) of Embodiment 1.

It was observed that, a metal layer was formed on the PA6T sheet, but together with leakage of plating. The plating speed and adhesion between the metal layer and the PA6T were both listed in Table 1.

Comparative Embodiment 3

The present Comparative Embodiment 3 includes the following steps.

Step 1) The step of preparing the doped tin oxide was substantially the same as the step 1) of Embodiment 1, with the exception that: the same amount of $V_2O_5$ was used instead of $Nb_2O_5$. The CIELab color value of the PA6T sheet was listed in Table 1.

Step 2) The step of preparing the PA6T sheet was substantially the same as the step 2) of Embodiment 1, with the exception that: the doped tin oxide was those obtained from the step 1) of Comparative Embodiment 3. The CIELab color value of the PA6T sheet was listed in Table 1.

Step 3) The PA6T sheet was irradiated with a laser under the same condition as described in the step 3) of Embodiment 1.

Step 4) The PA6T sheet irradiated with laser was subjected to a chemical plating under the same condition as described in the step 4) of Embodiment 1.

It was observed that, a metal layer was formed on the PA6T sheet, but with leakage of plating. The plating speed and adhesion between the metal layer and the PA6T were both listed in Table 1.

Comparative Embodiment 4

The present Comparative Embodiment 4 includes the following steps.

Step 1) The step of preparing the doped tin oxide was substantially the same as the step 1) of Embodiment 1, with the exception that: the second mixture was calcined under an nitrogen atmosphere. The CIELab color value of the PA6T sheet was listed in Table 1.

Step 2) The step of preparing the PA6T sheet was substantially the same as the step 2) of Embodiment 1, with the exception that: the doped tin oxide was those obtained from the step 1) of Comparative Embodiment 4. The CIELab color value of the PA6T sheet was listed in Table 1.

Step 3) The PA6T sheet was irradiated with a laser under the same condition as described in the step 3) of Embodiment 1.

Step 4) The PA6T sheet irradiated with laser was subjected to a chemical plating under the same condition as described in the step 4) of Embodiment 1.

It was observed that, it was not capable of forming a complete metal circuit on the PA6T sheet.

Embodiment 2

The present Embodiment 2 includes the following steps.
Step 1) The doped tin oxide was prepared by the same step 1) of Embodiment 1.
Step 2) The step of preparing the PA6T sheet was substantially the same as the step 2) of Embodiment 1, with the exception that: based on 100 weight parts of the PA6T, the amount of the doped tin oxide was 3 weight parts.

Step 3) The PA6T sheet was irradiated with a laser under the same condition as described in the step 3) of Embodiment 1.

Step 4) The PA6T sheet irradiated with laser was subjected to a chemical plating under the same condition as described in the step 4) of Embodiment 1.

It was observed that, a metal layer was formed on the PA6T sheet, without leakage of plating. The plating speed and adhesion between the metal layer and the PA6T were both listed in Table 1.

Embodiment 3

The present Embodiment 3 includes the following steps.

Step 1) The doped tin oxide was prepared by the same step 1) of Embodiment 1.

Step 2) The step of preparing the PA6T sheet was substantially the same as the step 2) of Embodiment 1, with the exception that: based on 100 weight parts of the PA6T, the amount of the doped tin oxide was 1 weight parts.

Step 3) The PA6T sheet was irradiated with a laser under the same condition as described in the step 3) of Embodiment 1.

Step 4) The PA6T sheet irradiated with laser was subjected to a chemical plating under the same condition as described in the step 4) of Embodiment 1.

It was observed that, a metal layer was formed on the PA6T sheet, without leakage of plating. The plating speed and adhesion between the metal layer and the PA6T were both listed in Table 1.

Embodiment 4

The present Embodiment 4 includes the following steps.

Step 1) Particles of $SnO_2$ were grinded in a grinding mill for 3 h together with $Nb_2O_5$ and ethanol, to form a first mixture. Based on 100 weight parts of $SnO_2$ and $Nb_2O_5$, the amount of ethanol was 300 weight parts. Based on the total amount of $SnO_2$ and $Nb_2O_5$, the content of $Nb_2O_5$ was 5 wt %. The first mixture was dried under an air atmosphere at 80° C. for 2 h, thus obtaining a second mixture having an average particle size of 2 μm. The second mixture was calcined under an air atmosphere at 1300° C. for 8 h and grinded to powders having an average particle size of 0.5 μm. The powders included doped tin oxide, and its CIELab color value and light reflectivity are listed in Table 1.

Step 2) The powders of doped tin oxide were mixed with polycarbonate (referred to as PC), antioxidant 1098 and talc to form a third mixture. Then the third mixture was extruded and pelleted with an extruder to form pellets. The pellets were injection molded in an injection mould, thus forming a PC sheet containing the doped tin oxide. Based on 100 weight parts of the PC, the amount of the doped tin oxide was 10 weight parts, the amount of the antioxidant 1098 was 8 weight parts, and the amount of the talc was 15 weight parts. The CIELab color value of the PC sheet was listed in Table 1.

Step 3) A surface of the PC sheet was irradiated with a laser provided by a YAG laser, to remove PC on a predetermined part (corresponding to the structure of a receiver) of the surface of the PC sheet. The laser had a wavelength of 1064 nm, a power of 4 W, a frequency of 30 kHz, a scanning speed of 1000 mm/s and a filling distance of 30 μm.

Step 4) The PC sheet irradiated with laser was subjected to a chemical plating under the same condition as described in the step 4) of Embodiment 1.

It was observed that, a metal layer was formed on the PC sheet, without leakage of plating. The plating speed and adhesion between the metal layer and the PC were both listed in Table 1.

Embodiment 5

The present Embodiment 5 includes the following steps.

Step 1) The step of preparing the doped tin oxide was substantially the same as the step 1) of Embodiment 4, with the exception that: the second mixture was calcined under an air atmosphere at 1350° C. for 8 h.

Step 2) The step of preparing the PC sheet was substantially the same as the step 2) of Embodiment 4, with the exception that: the doped tin oxide was those obtained from the step 1) of Embodiment 5.

Step 3) The PC sheet was irradiated with a laser under the same condition as described in the step 3) of Embodiment 4.

Step 4) The PC sheet irradiated with laser was subjected to a chemical plating under the same condition as described in the step 4) of Embodiment 1.

It was observed that, a metal layer was formed on the PA6T sheet, without leakage of plating. The plating speed and adhesion between the metal layer and the PA6T were both listed in Table 1.

Embodiment 6

The present Embodiment 6 includes the following steps.

Step 1) Particles of $SnO_2$ were grinded in a grinding mill for 6 h together with $Nb_2O_5$ and ethanol, to form a first mixture. Based on 100 weight parts of $SnO_2$ and $Nb_2O_5$, the amount of ethanol was 400 weight parts. Based on the total amount of $SnO_2$ and $Nb_2O_5$, the content of $Nb_2O_5$ was 4 wt %. The first mixture was dried under an air atmosphere at 50° C. for 6 h, thus obtaining a second mixture having an average particle size of 1 μm. The second mixture was calcined under an air atmosphere at 1200° C. for 8 h and grinded to powders having an average particle size of 0.8 μm. The powders included doped tin oxide, and its CIELab color value and light reflectivity are listed in Table 1.

Step 2) The powders of doped tin oxide were mixed with poly(butylene terephthalate) (referred PBT), antioxidant 1098 and talc to form a third mixture, and then the third mixture was extruded and pelleted with an extruder to form pellets. The pellets were injection molded in an injection mould, thus forming a PBT sheet containing the doped tin oxide. Based on 100 weight parts of the PBT, the amount of the doped tin oxide was 15 weight parts, the amount of the antioxidant 1098 was 8 weight parts, the amount of the talc was 20 weight parts. The CIELab color value of the PBT sheet was listed in Table 1.

Step 3) A surface of the PBT sheet was irradiated with a laser provided by a YAG laser, to remove PBT on a predetermined part (corresponding to the structure of a receiver) of the surface of the PC sheet. The laser had a wavelength of 1064 nm, a power of 6 W, a frequency of 30 kHz, a scanning speed of 1000 mm/s and a filling distance of 30 μm.

Step 4) The PBT sheet irradiated with laser was subjected to a chemical plating under the same condition as described in the step 4) of Embodiment 1.

It was observed that, a metal layer was formed on the PBT sheet, without leakage of plating. The plating speed and adhesion between the metal layer and the PBT were both listed in Table 1.

TABLE 1

|  | Doped tin oxide | | | | Polymer sheet Color value | | | Plating speed (μm/h) | Adhesion |
|---|---|---|---|---|---|---|---|---|---|
|  | Color value | | | Light reflectivity (wavelength of 1064 nm) | | | | | |
|  | L* | a | b |  | L* | a | b |  |  |
| Embodiment 1[1] | 81.44 | −1.03 | 3.11 | 29.88 | 84.24 | −0.25 | 1.29 | 5 | 0 |
| Comparative Embodiment 2 | 69.47 | −2.56 | −0.25 | 34.78 | 69.78 | −2.48 | 0.15 | 3 | 2 |
| Comparative Embodiment 3 | 69.22 | −3.58 | 2.52 | 47.74 | 69.88 | −2.58 | 3.35 | 3 | 3 |
| Comparative Embodiment 4 | 65.44 | −4.32 | −2.58 | 56.78 | / | / | / | / | / |
| Embodiment 2 | 81.44 | −1.03 | 3.11 | 29.88 | 85.66 | −1.25 | 0.55 | 5 | 1 |
| Embodiment 3 | 81.44 | −1.03 | 3.11 | 29.88 | 82.22 | −0.12 | −0.15 | 5 | 1 |
| Embodiment 4[2] | 81.11 | −2.03 | 2.23 | 21.75 | 83.26 | 1.22 | 4.32 | 5 | 0 |
| Embodiment 5 | 72.72 | −1.76 | 3.64 | 57.52 | 76.51 | −1.56 | 3.12 | 5 | 1 |
| Embodiment 6[3] | 85.56 | 1.20 | 2.35 | 22.85 | 87.12 | 2.21 | 2.26 | 5 | 1 |

[1] A PA6T sheet was prepared by the steps of substantially the same as the step 2) of Embodiment 1, with the exception that: only mixed PA6T and antioxidant 1010 to form a third mixture, without the doped tin oxide. Based on 100 weight parts of the PA6T, the amount of the antioxidant 1010 was 10 weight parts. The PA6T sheet has a CIELab color value L* of 83.89, a CIELab color value a of −0.15, and a CIELab color value b of 1.56.
[2] A PC sheet was prepared by the steps of substantially the same as the step 2) of Embodiment 4, with the exception that: only mixed PC, antioxidant 1098 and talc to form a third mixture, without the doped tin oxide. Based on 100 weight parts of the PC, the amount of the antioxidant 1098 was 8 weight parts, and the amount of the talc was 15 weight parts. The PC sheet has a CIELab color value L* of 83.12, a CIELab color value a of 1.54, and a CIELab color value b of 4.35.
[3] A PBT sheet was prepared by the steps of substantially the same as the step 2) of Embodiment 6, with the exception that: only mixed PBT, antioxidant 1098 and talc to form a third mixture, without the doped tin oxide. Based on 100 weight parts of the PBT, the amount of the antioxidant 1098 was 8 weight parts, and the amount of the talc was 20 weight parts. The PBT sheet has a CIELab color value L* of 87.55, a CIELab color value a of 2.30, and a CIELab color value b of 2.33.

It can be seen from Table 1 that, the doped tin oxide obtained from tin oxide doped with niobium-containing element and sintered under an oxidizing atmosphere, had a light color, and had very strong absorption power to light. Thereby, the doped tin oxide was capable of promoting chemical plating in a method of selectively metalizing the surface of the polymer substrate as a chemical plating promoter. Thus presetting the doped tin oxide in the polymer substrate, especially the polymer substrate with light color, does not or basically does not cover the original color of the polymer substrate, further does not obviously interfere with the color of the polymer substrate.

Moreover, the polymer substrate irradiated with a laser to remove PA6T on a predetermined part of the surface had a good plating activity. A higher plating speed was obtained and a continuous metal layer was formed without leakage of plating, together with higher adhesivity between the metal layer and the polymer substrate during chemical plating.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example", "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:
1. A polymer product comprising:
   a polymer substrate; and
   a metal layer formed on at least a part of a surface of the polymer substrate,
   wherein the surface of the polymer substrate covered by the metal layer is formed by a polymer composition comprising a polymer and a doped tin oxide, and
   wherein a doping element of the doped tin oxide comprises niobium, and the doped tin oxide has a coordinate L* value of about 70 to about 100, a coordinate a value of about −5 to about 5, and a coordinate b value of about −5 to about 5 in a CIELab color space.
2. The polymer product of claim 1, wherein the doped tin oxide has a light reflectivity of no more than 60% to a light with a wavelength of about 1064 nm.
3. The polymer product of claim 1, wherein based on a total weight of the doped tin oxide, content of the tin oxide is about 70 wt % to about 99.9 wt %, and content of the niobium is about 0.1 wt % to about 30 wt % calculated as $Nb_2O_5$.
4. The polymer product of claim 1, wherein the doped tin oxide has an average particle size of about 10 nm to about 10 μm.

5. The polymer product of claim 1, wherein the doped tin oxide is prepared by steps of:
   providing a powder mixture comprising a tin oxide and at least one compound containing the doping element, and
   sintering the powder mixture under an oxidizing atmosphere,
   wherein the compound comprises at least one of an oxide of the doping element and a precursor capable of forming the oxide of the doping element under the sintering.

6. The polymer product of claim 1, wherein in the polymer composition, based on 100 weight parts of the polymer, content of the doped tin oxide is about 1 to about 40 weight parts.

7. The polymer product of claim 1, wherein in the polymer composition, based on 100 weight parts of the polymer, content of the doped tin oxide is about 1 to about 5 weight parts.

8. A method for selectively metalizing a surface of a polymer substrate, comprising:
   removing at least a part of the polymer substrate by irradiating a surface of the polymer substrate with an energy source; and
   forming at least one metal layer on the surface of the polymer substrate by chemical plating;
   wherein the surface of the polymer substrate is formed by a polymer composition that comprises a polymer and a doped tin oxide, and
   wherein a doping element of the doped tin oxide comprises niobium, and the doped tin oxide has a coordinate $L^*$ value of about 70 to about 100, a coordinate a value of about −5 to about 5, and a coordinate b value of about −5 to about 5 in a CIELab color space.

9. The method of claim 8, wherein the doped tin oxide has a light reflectivity of no more than 60% to a light with a wavelength of about 1064 nm.

10. The method of claim 8, wherein based on the total weight of the doped tin oxide, content of the tin oxide is about 70 wt % to about 99.9 wt %, and content of the niobium is about 0.1 wt % to about 30 wt % calculated as $Nb_2O_5$.

11. The method of claim 8, wherein the doped tin oxide has an average particle size of about 10 nm to about 10 μm.

12. The method of claim 8, wherein the doped tin oxide is prepared by steps of:
    providing a powder mixture comprising a tin oxide and at least one compound containing the doping element, and
    sintering the powder mixture in an oxidizing atmosphere,
    wherein the compound comprises at least one of an oxide of the doping element and a precursor capable of forming the oxide of the doping element under the sintering.

13. The method of claim 8, wherein in the polymer composition, based on 100 weight parts of the polymer, content of the doped tin oxide is about 1 to about 40 weight parts.

14. The method of claim 8, wherein in the polymer composition, based on 100 weight parts of the polymer, content of the doped tin oxide is about 1 to about 5 weight parts.

15. The method of claim 8, wherein the energy source is a laser.

16. The method of claim 15, wherein the laser has a wavelength of about 1064 nm and a power of about 3-40 W.

17. The method of claim 8, wherein removing the part of the polymer substrate is performed by gasifying the part of the polymer substrate.

18. A polymer product produced by the method according to claim 8.

* * * * *